United States Patent
Humphreys et al.

(10) Patent No.: US 6,731,145 B1
(45) Date of Patent: May 4, 2004

(54) PHASE-LOCKED LOOP HAVING LOOP GAIN AND FREQUENCY RESPONSE CALIBRATION

(75) Inventors: Scott Robert Humphreys, Greensboro, NC (US); Barry Travis Hunt, Jr., Greensboro, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 10/409,291

(22) Filed: Apr. 8, 2003

Related U.S. Application Data

(60) Provisional application No. 60/402,149, filed on Aug. 9, 2002.

(51) Int. Cl.$^7$ ................................................ H03L 7/06
(52) U.S. Cl. ........................................ 327/156; 327/147
(58) Field of Search ................................ 327/156, 147, 327/148, 150, 151, 157, 160

(56) References Cited

U.S. PATENT DOCUMENTS 4,206,398 A * 6/1980 Janning ..................... 324/509
5,382,923 A * 1/1995 Shimada et al. ............... 331/8
6,046,646 A * 4/2000 Lo et al. ...................... 331/10
6,542,040 B1 * 4/2003 Lesea .......................... 331/11

* cited by examiner

Primary Examiner—Timothy P. Callahan
Assistant Examiner—Cassandra Cox
(74) Attorney, Agent, or Firm—Withrow & Terranova, PLLC

(57) ABSTRACT

The invention provides an apparatus and method for calibrating both the pole/zero locations and the gain of a charge pump phase-locked loop's (PLL's) frequency response with one calibration operation. In one embodiment, the calibration is performed using a bandgap voltage reference and a stable frequency reference in order to measure a slew rate (I/C), defined as a current-to-capacitance ratio, and then adjusting the RC time constant (tRC) by adjusting the capacitance value. The adjustment setting is used in the loop filter capacitors, thereby calibrating the pole and zero locations of the PLL, which depend on the RC product. The charge pump reference current is proportional to the ratio of the bandgap voltage to the resistor value. When the capacitance is adjusted, the slew rate is calibrated as well, wherein the slew rate represents a portion of the loop gain of the PLL.

16 Claims, 4 Drawing Sheets

PHASE-LOCKED LOOP HAVING LOOP GAIN AND FREQUENCY RESPONSE CALIBRATION

This application claims the benefit of provisional patent application Ser. No. 60/402,149, filed Aug. 9, 2002, the disclosure of which is hereby incorporated by reference in its entirety.

FIELD OF THE INVENTION

The present invention relates to phase-locked loops, and particularly relates to improving the performance of a phase-locked loop using a calibration circuit.

BACKGROUND OF THE INVENTION

Frequency synthesizers are commonly used to generate radio frequency (RF) signals for use in communication systems. A common form of frequency synthesizer is the charge pump phase-locked loop (PLL).

In modern portable communication systems, it is desirable to integrate as many components and devices as possible into low-cost integrated circuits (ICs), thereby reducing the material and manufacturing costs associated with discrete components. Examples of integrated frequency synthesizers can be found in most microprocessors and in many low-performance transceivers. However, the use of integrated frequency synthesizers in high-performance cellular or wireless LAN communication systems has been limited; for example, the voltage-controlled oscillator (VCO) and loop filter are typically external components, while the remaining loop components are integrated on a single IC. The use of a high reference frequency ($F_R$), such as afforded by communications systems with wide channel spacings or fractional-N frequency synthesis, reduces the contribution of charge pump and loop filter noise components to the output spectrum to the point where full integration becomes possible.

The use of fractional-N synthesis also enables digital modulation for phase or frequency based systems. Modern communication systems, such as the Global System for Mobile Communication (GSM) cellular telephone system, impose strict requirements on the locktime and noise performance of the transmitted signal, and on the signals used for mixing in the receiver. For example, the transmit locktime must typically be under 250 $\mu$s to settle the VCO to under 100 Hz error, and the transmitted phase noise must be under 113 dBc/Hz at 400 kHz offset. If the loop bandwidth is too wide, the noise performance specification may not be met, and if the loop bandwidth is too narrow, the locktime specification may not be met. In addition, the phase error of the transmitted signal must remain small (under 5 degrees root-mean-square in the GSM system). Variations in loop gain and bandwidth can degrade the performance of fractional-N based transmit systems in which a predistortion filter is used to compensate for the rolloff of the loop response.

Thus, the variations inherent to transistor, resistor, and capacitor devices in low cost semiconductor processes leads to unacceptable variations in the loop bandwidth and gain, degrading the locktime, noise, and phase error of the frequency synthesizer.

Hence, there remains a need for a calibration system to cancel out the undesirable process and environmental variations that degrade the performance of integrated frequency synthesizers while providing a desired, arbitrary level of accuracy with minimal overhead in terms of device area and calibration time. Ideally this calibration system should function automatically, with little or no user intervention, and the calibration should complete rapidly enough to be performed each time the frequency synthesizer is enabled.

SUMMARY OF THE INVENTION

The invention provides an apparatus for calibrating both the pole/zero locations and the gain of a charge pump phase-locked loop's (PLL) frequency response with one calibration operation. In one embodiment, the calibration is performed using a bandgap voltage reference and a stable frequency reference in order to measure a slew rate of a reference capacitor, wherein the slew rate is defined as a current-to-capacitance ratio (I/C). The RC time constant (RC) of a loop filter is then adjusted based on the measured slew rate by adjusting the capacitance values of variable capacitor arrays in the loop filter, thereby calibrating the pole and zero locations of the PLL, which depend on the RC product. A charge pump reference current required by a charge pump in the PLL is proportional to a timing current used to measure the slew rate, wherein both the charge pump reference current and the timing current are proportional to a reference current, thereby correlating the RC time constant and the slew rate. Therefore, the adjustment of the capacitance values of the loop filter calibrates the slew rate as well as the RC time constant, wherein the slew rate represents a portion of the loop gain of the PLL. In one embodiment, a frequency synthesizer including the calibration circuit is implemented in a single integrated circuit (IC).

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
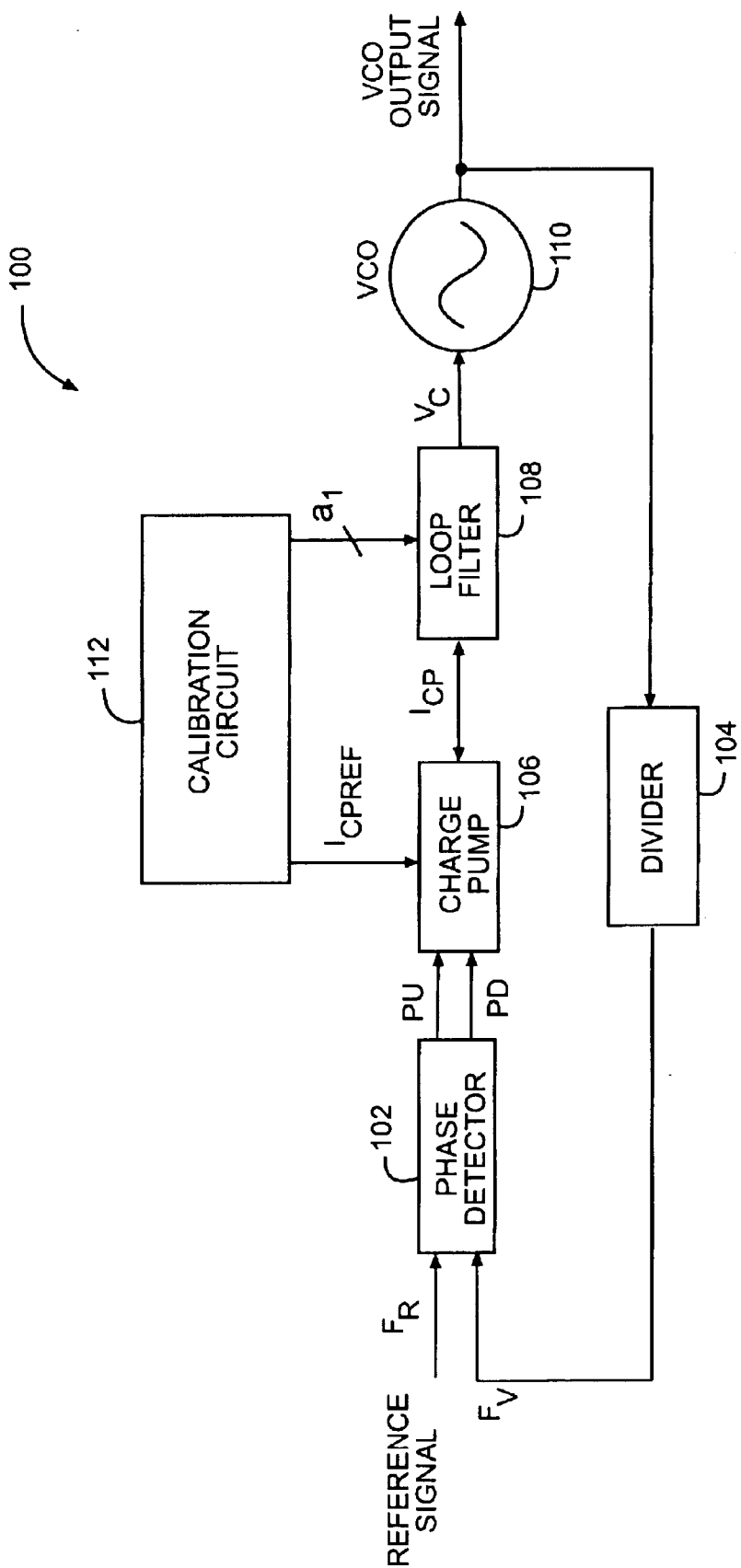
FIG. 1 is a simplified block diagram of the preferred embodiment of the phase-locked loop of the present invention.

Referring to FIG. 1, a phase-locked loop 100 is illustrated according to one embodiment of the present invention. A phase detector 102 is typically an asynchronous digital logic circuit that pulses either a pump up (PU) or a pump down (PD) signal for the duration of time between rising edges on a reference signal ($F_R$) and a divided VCO (Fv) signal, wherein the divided VCO signal is from a divider 104. The PU and PD signals cause a charge pump 106 to source one or more pulses of current ($I_{CP}$) to a loop filter 108 or sink one or more pulses of current ($I_{CP}$) from the loop filter 108, wherein the charge pump current ($I_{CP}$) is typically generated by an integrated current reference (not shown). The pole and zero locations are also determined by resistor and capacitor device characteristics. The loop filter 108 is typically a passive or active RC filter, and the one or more pulses of current are integrated and stored by capacitance of the loop filter 108 as charge. The output voltage ($V_C$) of the loop filter 108 is a function of this charge, and acts as a control voltage for a voltage controlled oscillator (VCO) 110. The calibration circuit 112 acts to remove various types of error from the PLL 100. The divider 104 is typically a programmable integer or fractional divider, which is used to set the output frequency of the VCO 110. The PLL 100 acts as a feedback control system to drive the phase (and therefore frequency) error of the $F_R$ and $F_V$ signals to zero. Since $F_V = F_{VCO}/N$, where N is the divider modulus, the VCO frequency is set to $F_{VCO} = N\ F_R$.

Figure 2:
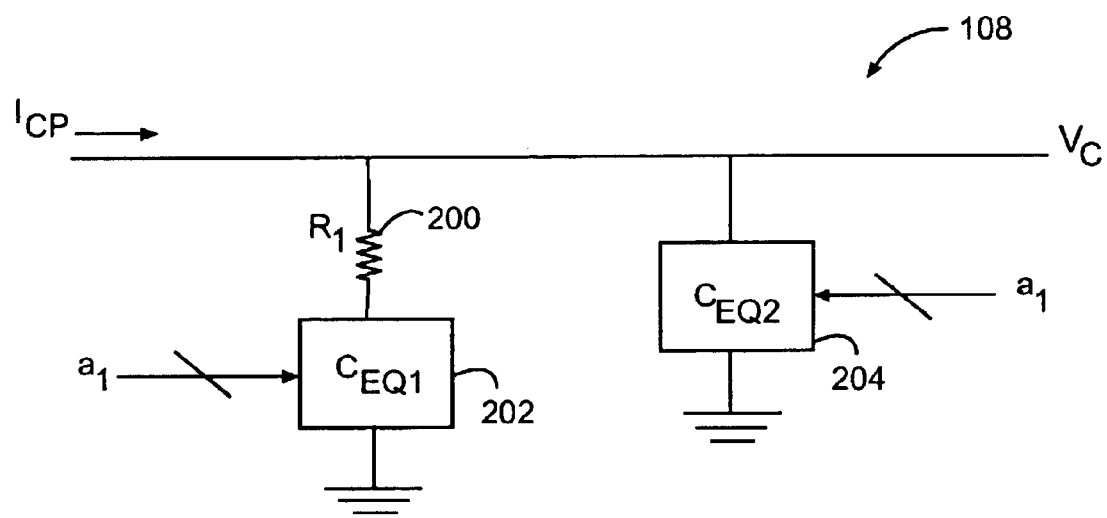
FIG. 2 illustrates a simplified loop filter according to one embodiment of the present invention.

The behavior of the PLL 100 in terms of noise and dynamic response is determined by the loop gain of the system. The loop gain is given by:

$$G(s) = \frac{I_{CP} K_v F(s)}{sN},$$

where s is the Laplace frequency variable, $I_{CP}$ is the charge pump current in amperes (A), $K_V$ is the tuning gain in cycles-per-second-per-volt (Hz/V), F(s) is the loop filter transfer function, and N is the VCO divider modulus. Further, the loop filter 108, as illustrated in FIG. 2, includes a loop filter resister ($R_1$) 200, first variable capacitor array ($C_{EQ1}$) 202, and second variable capacitor array ($C_{EQ2}$) 204 and has the following transfer function:

$$F(s) = \frac{1}{sC} \frac{(s\tau_z + 1)}{(s\tau_p + 1)}$$

where $C = C_{EQ1} + C_{EQ2}$, $\tau_z = R_1 C_{EQ1}$, $$\tau_p = \left(\frac{R_1 C_{EQ1} C_{EQ2}}{C_{EQ1} + C_{EQ2}}\right) = R_1 C_{EQTOTAL}, \text{ and } C_{EQTOTAL} = \frac{C_{EQ1} C_{EQ2}}{C_{EQ1} + C_{EQ2}}.$$

Substituting these expressions for F(s):

$$G_{ol} = \frac{K_V}{s^2 N}\left(\frac{I_{CP}}{C}\right)\frac{sR_1 C_1 + 1}{sR_1 C_{EQTOTAL} + 1}.$$

Therefore, the loop gain depends on the transfer function of the loop filter 108 and more particularly to the slew rate (I/C). Further, the transfer function, F(s), of the loop filter 108 of the present invention depends on the capacitance of $C_{EQ1}$ and $C_{EQ2}$, which are controlled by a capacitance selection signal ($a_1$) from the calibration circuit 112.

Figure 3:
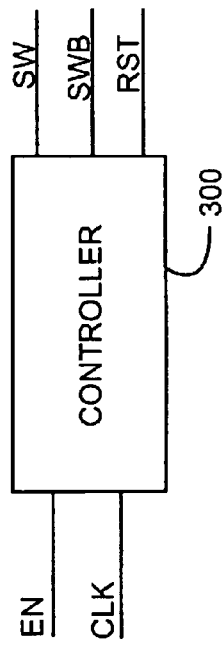
FIG. 3 illustrates a controller of the calibration circuit according to one embodiment of the present invention.
Figure 4:
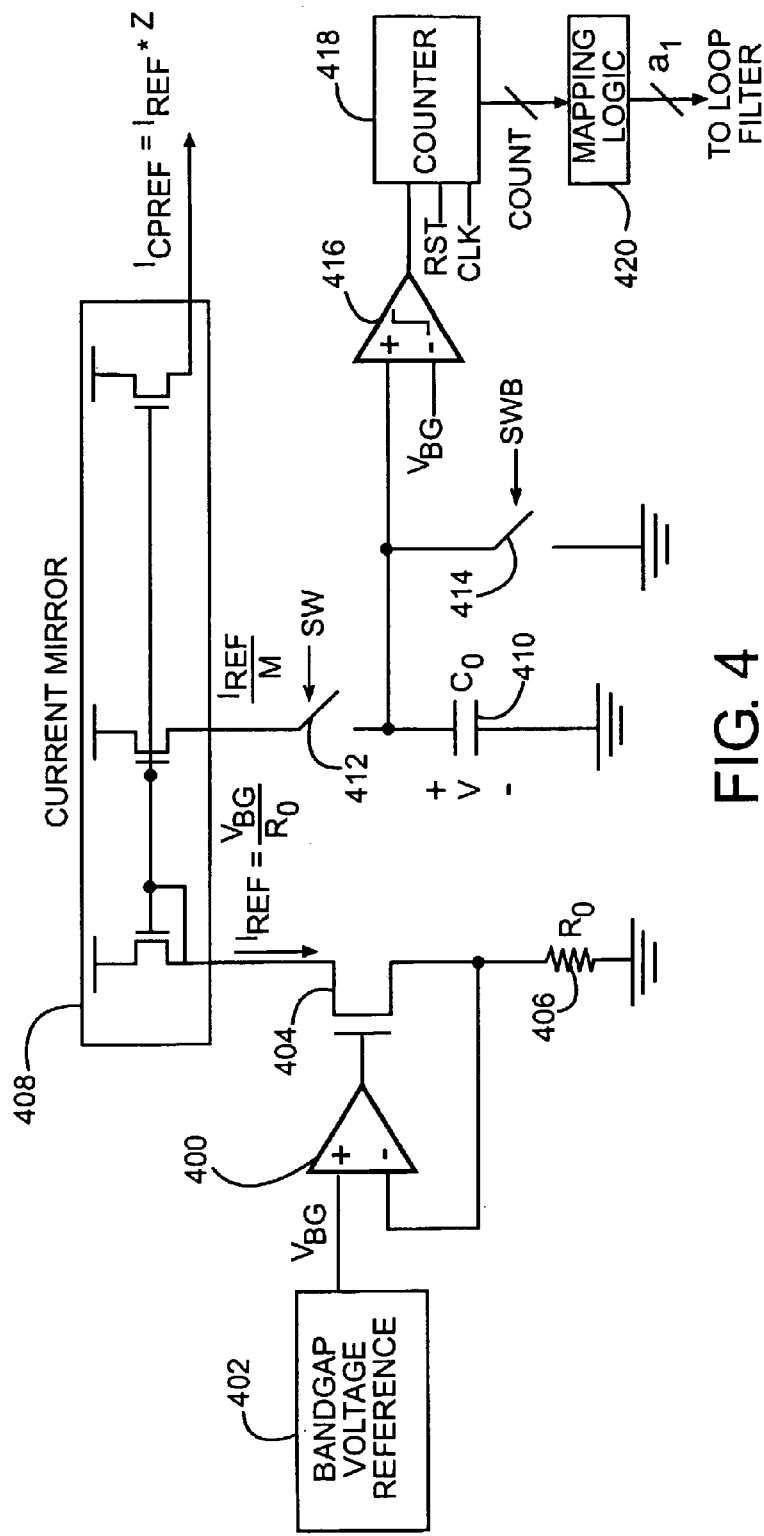
FIG. 4 illustrates the calibration circuit according to one embodiment of the present invention.

FIGS. 3 and 4 illustrate a calibration controller 300 associated the calibration circuit 112, and show the calibration circuit 112 in more detail, respectively. The calibration circuit 112 is adapted to provide RC time constant and slew rate (I/C) calibration. The calibration controller 300 of FIG. 3 is preferably, but not necessarily, part of the calibration circuit 112. The controller 300 asserts or deasserts a first switch control signal (SW), a second switch control signal (SWB), and a reset signal (RST) depending on an enable signal (EN), which in one embodiment may be a frequency synthesizer enable signal from the controller of a mobile telephone, and a reference clock signal (CLK). FIG. 4 illustrates the calibration circuit 112 including a first voltage comparator 400, a bandgap voltage reference 402, a transistor 404, a resistor ($R_0$) 406, a current mirror 408, a capacitance circuit, and a detection and control circuit. The capacitance circuit includes a capacitor ($C_0$) 410, a first switch 412, and a second switch 414, and the detection and control circuit includes a second voltage comparator 416, a counter 418, and mapping logic 420.

In order to fully appreciate the calibration controller 300 and calibration circuit 112 as shown in FIGS. 3 and 4, the correlation between the RC time constant and the slew rate is first described. First, the loop gain constant can be expressed as a function of the nominal loop gain and the tolerances on the various component terms:

$$G_{ol} = \frac{I_{CP_o} K_V}{N_o C_o} \frac{(1 + \varepsilon_I)(1 + \varepsilon_{KV})}{(1 + \varepsilon_N)(1 + \varepsilon_C)},$$

where the $\varepsilon_X$ terms are error factors for each nominal value term. The RC time constants are simply determined by:

$$RC = R_0 C_0 (1 + \varepsilon_R)(1 + \varepsilon_C).$$

These equations demonstrate that there are five sources of variation: VCO tuning gain ($\varepsilon_{KV}$), charge pump reference current ($\varepsilon_I$), loop divider value ($\varepsilon_N$), and resistor ($\varepsilon_R$) and capacitor ($\varepsilon_C$) tolerance. The VCO tuning gain may be calibrated by a separate system, or may be controlled by design to be within a given range. The loop divider value is known from the design or, in the preferred embodiment, from the programming of the IC. This leaves the slew rate (I/C) and the RC time constant values. The RC time constant and the slew rate can be calibrated independently against timing from the stable reference source, such as a 13 or 26 MHz crystal oscillator. However, the present invention correlates the RC time constant and the slew rate, and therefore a single calibration is used to calibrate both the RC time constant and the slew rate.

Calibration adjustments can be viewed as correction factors that null out the variations from the various sources of error, setting the loop gain and RC time constant equal to their desired, nominal values. Thus, ignoring variation on the VCO divider modulus, N, and the tuning gain, $K_V$, we can determine correction factors for the slew rate ($a_{IC}$) and the RC time constant ($a_{RC}$):

$$G_{ol} = \frac{a_{IC}I_{CPo}K_V}{N_oC_o}\frac{(1+\varepsilon_I)}{(1+\varepsilon_C)} = \frac{a_{IC}I_oK_V}{N_oC_o} \Rightarrow a_{IC} = \frac{(1+\varepsilon_C)}{(1+\varepsilon_I)} \text{ and}$$

$$RC = a_{RC}R_oC_o(1+\varepsilon_R)(1+\varepsilon_C) = R_oC_o \Rightarrow a_{RC} = \frac{1}{(1+\varepsilon_R)(1+\varepsilon_C)}.$$

If the charge pump reference current ($I_{CPREF}$) is derived from a known voltage reference, such as the bandgap voltage reference 402, and the resistor ($R_0$) 406 is of the same type as used in the filter 108, the correction factors for the loop gain via the slew rate and the RC time constant become correlated, to within the accuracy of the bandgap voltage reference 402, which should be quite good:

$$I_{CPREF} = I_{CPREFo}(1+\varepsilon_I) = zI_{REFo}(1+\varepsilon_I) = \frac{zV_{BG}}{R_o}\frac{(1+\varepsilon_{BG})}{(1+\varepsilon_R)} \Rightarrow$$

$$(1+\varepsilon_I) = \frac{(1+\varepsilon_{BG})}{(1+\varepsilon_R)} \Rightarrow a_{IC} = \frac{(1+\varepsilon_R)(1+\varepsilon_C)}{(1+\varepsilon_{BG})} = \frac{1}{a_{RC}(1+\varepsilon_{BG})},$$

where $I_{CPREF}$ is defined as the product of $I_{REF}$ and $z$, and $z$ is a known constant defined by the ratio of the current mirror 408. Therefore, by deriving the charge pump reference current from the bandgap voltage reference 402 and the resistor ($R_0$) 406, which define the reference current ($I_{REF}$), one calibration can set both the loop gain and pole/zero locations based on the RC time constant and the slew rate.

During calibration, the first variable capacitor array ($C_{EQ1}$) and the second variable capacitor array ($C_{EQ2}$) are adjusted, via the signal $a_1$, such that the RC time constant is correct, as measured against the reference clock:

$$\frac{V}{T} = \frac{I}{C} = \frac{IR}{T} \Rightarrow RC = T.$$

Because we set the current by $V_{BG}/R_0$, the slew rate can be defined as:

$$\frac{I}{C} = \frac{V_{BG}}{T}.$$

In effect, by adjusting the capacitance of the first variable capacitance array ($C_{EQ1}$) and the second variable capacitance array ($C_{EQ2}$) via the signal $a_1$, such that the slew rate is correct, then the RC time constant will also be correct if the filter resistor 200 is similarly adjusted and built from the same material. The use of two stable references, the bandgap voltage reference 402 and the frequency reference, allows both calibrations with one measurement.

The following equations illustrate the effect. From the RC calibration:

$$a_{RC}RC = a_{RC}R_oC_o(1+\varepsilon_R)(1+\varepsilon_C) = R_oC_o \Rightarrow a_{RC} = \frac{1}{(1+\varepsilon_R)(1+\varepsilon_C)}.$$

Then $$\frac{I_{CPREF}}{C} = \frac{V_{BG}}{RC} = \frac{V_{BG}}{a_{RC}RC} = \frac{V_{BG}}{a_{RC}R_oR_o(1+\varepsilon_R)(1+\varepsilon_C)} = \frac{V_{BG}}{R_oC_o} = \frac{I_{CPREFo}}{C_o},$$

where $R$ and $C$ are the actual values of the resistor 406 and the capacitor 410 and $R_0$ and $C_0$ are the nominal values of the resistor 406 and the capacitor 410.

The RC time constant with calibration according to the present invention can be described as:

$$RC = R_oC_o(1+\varepsilon_{RC})\left(\frac{C_{base}}{C_o} + \frac{N}{(2^b-1)}\frac{C_{var}}{C_o}\right) = R_oC_o,$$

where the error factor ($1+\epsilon_{RC}$) is equal to the product of the resistor and capacitor error terms ($1+\epsilon_R$)($1+\epsilon_C$), $C_{base}$ is the fixed capacitance, $C_{var}$ is the total value of the switched element array, $N$ is the value of the binary array control word, and $b$ is the number of bits or switched elements in the variable array. $N$ can range from 0 to $2^b-1$.

We can determine the required values of $C_{base}$ and $C_{var}$ from the minimum and maximum values of $\epsilon_{RC}$, which occur when $N=0$ and $N=2^b-1$, respectively.

$$C_{base} = \frac{C_o}{(1+\varepsilon_{RC\max})}$$

$$C_{var} = C_o\left(\frac{1}{(1+\varepsilon_{RC\min})} - \frac{1}{(1+\varepsilon_{RC\max})}\right).$$

The number of switched elements determines the resolution, or the residual error after calibration.

For measurement, we use the counter 418 running at a rate $F_{clk}$ to determine the time it takes to charge $C_0$ from ground to $V_{BG}$. A nominal count value, counts, is given by:

$$count_o = TF_{clk} = \frac{V_{BG}C}{I}F_{clk} = MR_oC_oF_{clk},$$

where $M$ is a mirror reduction ratio, which decreases the reference current, thereby providing the timing current ($I_{REF}/M$) to the capacitor ($C_0$) 410. Reducing the value of the reference current to provide the timing current provides the ability to increase the number of counts or decrease the reference values of $R_0$ 406 and $C_0$ 410 to keep the area of the IC reasonable.

The count obtained for the actual RC circuit will deviate from the nominal value by an amount dependent on the resistor and capacitor error terms:

$$count = MR_oC_oF_{clk}(1+\epsilon_{RC}) = count_o(1+\epsilon_{RC}).$$

This allows the development of a mapping between the count value and the switched array control word N.

$$R_oC_o(1+\varepsilon_{RC})\left(\frac{C_{base}}{C_o} + \frac{N}{(2^b-1)}\frac{C_{var}}{C_o}\right) = R_oC_o \Rightarrow \left(\frac{C_{base}}{C_o} + \frac{N}{(2^b-1)}\frac{C_{var}}{C_o}\right) =$$

$$\frac{1}{(1+\varepsilon_{RC})} = \frac{count_o}{count} \Rightarrow N = (2^b-1)\left[\frac{count_o}{count} - \frac{C_{base}}{C_o}\right]\frac{C_o}{C_{var}}.$$

This mapping between the counter value and the control word N allows the design to be parameterized and reused for different resolutions.

Figure 5:
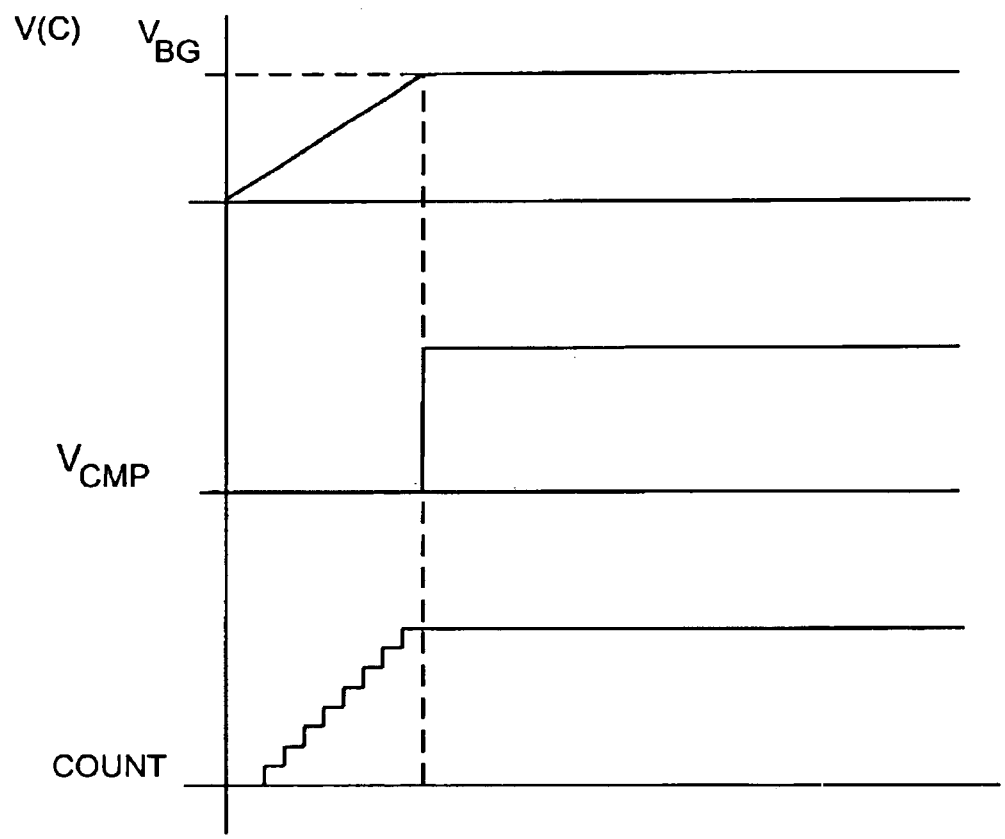
FIG. 5 illustrates the relationship between capacitor voltage, voltage comparator output, and counter state of the calibration circuitry according to one embodiment of the present invention.

Still referring to FIGS. 3 and 4, the calibration controller 300 is enabled by an external enable signal (EN), such as an enable signal for the frequency synthesizer, and by a reference clock source (CLK), which may also run the counter 418. The reference clock for the calibration controller 300 and the reference clock for the counter 418 do not need to be the same clock, but the counter 418 must run off of a known, stable frequency reference. In one embodiment, the external enable signal (EN) may be controlled by a host microprocessor in a cellular phone. When the enable signal is deasserted (inactive), the counter 418 is reset and the capacitor ($C_0$) 410 is shorted to ground (SW is deasserted, SWB is asserted), guaranteeing that the capacitor ($C_0$) 410 is discharged before calibration starts. When the enable signal is asserted, the controller 300 asserts SW to close the first switch 412 in the charging circuit, deasserts SWB to open the second switch 414 thereby removing the short to ground, and deasserts the counter reset signal (RST) allowing the counter 418 to begin counting. As illustrated in FIG. 5, the counter 418 continues to run until the voltage (V(c)) on the capacitor ($C_O$) 410 rises above the reference (bandgap) voltage thereby triggering the comparator 416, which freezes the counter 418. Note that the voltage reference does not need to be a bandgap voltage, but may be any stable, known voltage reference. The value in the counter 418 indicates the elapsed time, and therefore the slew rate. This counter value is then mapped, as discussed above, through the mapping logic 420 to provide the appropriate switch setting to the first and second variable capacitor arrays, 202 and 204, in the loop filter 108. This capacitance selection signal ($a_1$) may be used by other RC filters on the IC, assuming they use the same type of resistor and capacitor device.

Figure 6:
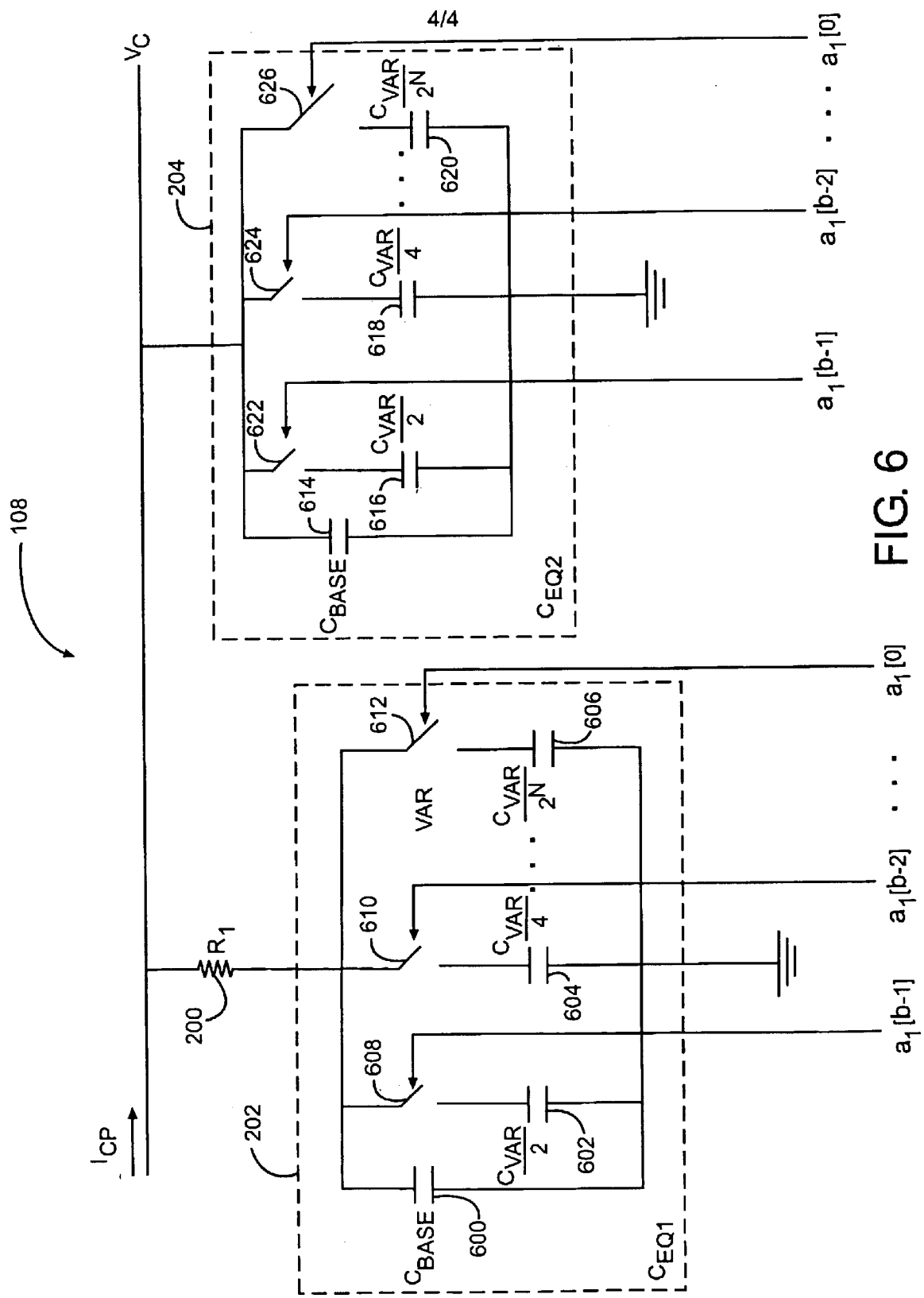
FIG. 6 is a detailed illustration of the loop filter according to one embodiment of the present invention.

The exemplary embodiment of the loop filter 108 of the present invention is illustrated in FIG. 6. In this embodiment, the loop filter 108 comprises the series combination of the resistor ($R_1$) 200 and the first variable capacitor array ($C_{EQ1}$) 202 connected in parallel with the second variable capacitor array ($C_{EQ2}$) 204. Further, the first variable capacitor array 202 comprises a base capacitor ($C_{base}$) 600 connected in parallel with variable capacitors ($C_{var}$) 602, 604, and 606. The capacitance of the first variable capacitor array 202 is controlled by the signal a, received from the calibration circuitry 112 either asserting or disserting one or more of switches 608, 610, and 612. More particularly, switches 608, 610, and 612 are controlled by associated bits $a_1[b-1]$, $a_1[b-2]$, and $a_1[0]$ in the $a_1$ signal. The second variable capacitor array 204 operates in a similar fashion to the first variable capacitor array 202 and comprises a base capacitor 614, variable capacitors 616, 618, and 620, and switches 622, 624, and 626. The values of the base capacitors 600 and 614 and the variable capacitors 602, 604, 606, 616, 618, and 620 depend on varying design constraints. Therefore, base capacitors 600 and 614 should not be limited to the case where the two are equal. Further, variable capacitors 602, 604, and 606 and variable capacitors 616, 618, and 620 should not be limited to the case where $C_{var}$ for the first variable capacitor array 202 is equal to $C_{var}$ for the second variable capacitor array 204. As shown, the preferred embodiments of the first and second variable capacitor arrays 202 and 204 use binary weighting, however, any other weighting scheme, such as unitary weighting, could be used and should be considered within the spirit and scope of the present invention.

Essentially, the RC time constant of the loop filter 108 is calibrated by determining the actual time taken to charge the capacitor 410 to the stable reference voltage level. The timing current used to charge the capacitor 410 and the charge pump reference current are proportional to the reference current ($I_{REF}$), from which both the timing current ($I_{REF}/M$) and the charge pump reference current ($I_{CPREF}$) are derived. These proportional currents are used to correlate the RC time constant and the slew rate. The actual time is used along with the corresponding nominal time to determine the capacitance selection signal value needed to adjust the variable capacitor arrays, 202 and 204, to their nominal values, thereby calibrating the RC time constant. Once this calibration has occurred, the slew rate, and therefore the loop gain, has also been calibrated due to their correlation with the RC time constant.

In an implementation of the invention, a six bit counter having a maximum value of 63 is used with a clock rate $F_{clk}$ of 13 MHz. This implementation has a maximum duration of 63/13e6 seconds, or 4.8 us, which is sufficiently fast enough to be run each time the synthesizer is enabled.

Those skilled in the art will recognize improvements and modifications to the preferred embodiments of the present invention. All such improvements and modifications are considered within the scope of the concepts disclosed herein and the claims that follow.

We claim:

1. A phase-locked loop comprising:
   a loop filter comprising one or more variable capacitor arrays each having a selectable capacitance responsive to a capacitance selection signal; and
   a calibration circuit comprising:
   a capacitance circuit adapted to receive a timing current wherein said timing current charges said capacitance circuit; and
   a detection and control circuit adapted to determine a charging time associated with said capacitance circuit and provide said capacitance selection signal to select a capacitance of said loop filter based on said charging time.

2. The phase-locked loop of claim 1 further comprising a charge pump operatively associated with said loop filter and requiring a charge pump reference current wherein said charge pump reference current and said timing current are proportional to a reference current thereby correlating a RC time constant of said loop filter and a slew rate of the phase-locked loop.

3. The phase-locked loop of claim 2 wherein said timing current and said charge pump reference current are derived from said reference current.

4. The phase-locked loop of claim 3 wherein said calibration circuitry further comprises a voltage reference and associated logic adapted to provide said reference current.

5. The phase-locked loop of claim 3 wherein said calibration circuit further comprises a current mirror adapted to provide said timing current and said charge pump reference current based on said reference current.

6. The phase-locked loop of claim 1 wherein said detection and control circuit determines said charging time by measuring a time required to charge said capacitance circuit, said detection and control circuit adapted to select a value for said capacitance selection signal based on said charging time.

7. The phase-locked loop of claim 1 wherein said detection and control circuit comprises a counter adapted to measure said charging time.

8. The phase-locked loop of claim 7 wherein said calibration circuit further comprises a calibration controller adapted to control charging and discharging of said capacitance circuit and to start and reset said counter such that said counter begins a counting sequence when said capacitance circuit begins charging.

9. The phase-locked loop of claim 7 wherein said detection and control circuit further comprises a voltage comparator adapted to provide said counter with a control signal when a capacitance voltage associated with said capacitance circuit becomes essentially equal to a reference voltage.

10. The phase-locked loop of claim 1 wherein said detection and control circuit further comprises mapping logic adapted to map said charging time to the value for said capacitance selection signal.

11. The phase-locked loop of claim 1 wherein each of said one or more variable capacitor arrays comprises a base capacitor and a series of variable capacitors each connected in parallel with said base capacitor through a corresponding series of switches.

12. The phase-locked loop of claim 11 wherein each of said series of switches are controlled by a corresponding bit of the capacitance selection signal from said calibration circuit.

13. The phase-locked loop of claim 1 wherein each of said one or more variable capacitor arrays have capacitances defined by a binary weighting scheme.

14. The phase-locked loop of claim 1 wherein each of said one or more variable capacitor arrays have capacitances defined by a unitary weighting scheme wherein each of said variable capacitor arrays have essentially equal capacitances.

15. The phase-locked loop of claim 1 wherein said loop filter further comprises one or more resistors manufactured in the same material as said one or more variable capacitor arrays.

16. The phase-locked loop of claim 1 wherein said loop filter and said calibration circuit are integrated into a single semiconductor die.

* * * * *